United States Patent
Annunziata et al.

(10) Patent No.: US 9,853,210 B2
(45) Date of Patent: Dec. 26, 2017

(54) REDUCED PROCESS DEGRADATION OF SPIN TORQUE MAGNETORESISTIVE RANDOM ACCESS MEMORY

(71) Applicant: International Business Machines Corporation, Armonk, NY (US)

(72) Inventors: Anthony J. Annunziata, Stamford, CT (US); Gen P. Lauer, Yorktown Heights, NY (US); Nathan P. Marchack, White Plains, NY (US); Stephen M. Rossnagel, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/943,247

(22) Filed: Nov. 17, 2015

(65) Prior Publication Data
US 2017/0141299 A1 May 18, 2017

(51) Int. Cl.
*H01L 43/12* (2006.01)

(52) U.S. Cl.
CPC .................................. *H01L 43/12* (2013.01)

(58) Field of Classification Search
CPC .......... H01L 43/12; H01L 23/28; H01L 23/29
See application file for complete search history.

(56) References Cited

U.S. PATENT DOCUMENTS

| 6,207,472 | B1* | 3/2001 | Callegari | ............ | H01L 51/0545 |
| | | | | | 257/E21.272 |
| 7,267,997 | B1* | 9/2007 | Sharma | ................. | B82Y 25/00 |
| | | | | | 257/E21.665 |
| 8,466,539 | B2 | 6/2013 | Li et al. | | |
| 9,015,927 | B2 | 4/2015 | Abraham et al. | | |
| 9,035,403 | B2 | 5/2015 | Worledge | | |
| 9,054,300 | B2 | 6/2015 | Annunziata et al. | | |
| 9,070,868 | B2 | 6/2015 | Annuziata et al. | | |
| 2004/0120097 | A1* | 6/2004 | Chambers | .............. | H01G 4/008 |
| | | | | | 361/301.2 |
| 2004/0264068 | A1* | 12/2004 | Kanaya | .................. | B82Y 25/00 |
| | | | | | 360/324.2 |
| 2005/0037240 | A1* | 2/2005 | Haoto | ................. | C23C 14/0676 |
| | | | | | 428/698 |
| 2006/0193550 | A1* | 8/2006 | Wawro | ................. | G01N 21/648 |
| | | | | | 385/12 |
| 2007/0080381 | A1* | 4/2007 | Chien | .................... | B82Y 25/00 |
| | | | | | 257/295 |
| 2009/0261437 | A1* | 10/2009 | Kang | ...................... | H01L 43/12 |
| | | | | | 257/422 |

(Continued)

OTHER PUBLICATIONS http://www.abletarget.com/silicon-nitride/.*

*Primary Examiner* — Benjamin Sandvik
*Assistant Examiner* — Farid Khan
(74) *Attorney, Agent, or Firm* — Cantor Colburn LLP; Vazken Alexanian

(57) ABSTRACT

A method of making a magnetic random access memory (MRAM) device includes forming a magnetic tunnel junction (MTJ) on an electrode, the MTJ including a reference layer positioned in contact with the electrode, a free layer, and a tunnel barrier layer arranged between the reference layer and the free layer; and depositing an encapsulating layer on and along sidewalls of the MTJ by physical sputtering or ablation of a target material onto the MTJ.

9 Claims, 5 Drawing Sheets

(56) References Cited

U.S. PATENT DOCUMENTS

| | | | |
|---|---|---|---|
| 2010/0283049 A1* | 11/2010 | Sato | H01L 29/78606 257/43 |
| 2011/0140097 A1* | 6/2011 | Cheong | H01L 29/66742 257/43 |
| 2013/0015538 A1* | 1/2013 | Liu | H01L 43/12 257/421 |
| 2013/0049144 A1* | 2/2013 | Tang | H01L 43/12 257/421 |
| 2013/0126995 A1* | 5/2013 | Ogihara | H01L 43/12 257/421 |
| 2014/0061827 A1 | 3/2014 | Huang et al. | |
| 2014/0085971 A1* | 3/2014 | Nagamine | H01L 43/02 365/158 |
| 2015/0044781 A1* | 2/2015 | Tokashiki | H01L 43/12 438/3 |
| 2015/0255712 A1* | 9/2015 | Tsubata | H01L 43/12 257/295 |
| 2016/0252506 A1* | 9/2016 | Daunais | B82Y 10/00 |

* cited by examiner

REDUCED PROCESS DEGRADATION OF SPIN TORQUE MAGNETORESISTIVE RANDOM ACCESS MEMORY

BACKGROUND

The present invention relates to spin-transfer torque magnetoresistive random access memory (STT-MRAM devices), and more specifically, to stack structures and etch processes in STT-MRAM devices.

STT-MRAM devices have some benefits over semiconductor-based memories, such as dynamic random-access memory (DRAM) and static random-access memory (SRAM). However, in order to compete with DRAM and SRAM, the STT-MRAM devices are integrated into the wiring layers of standard silicon logic and memory chips.

STT-MRAM device is a type of solid state, non-volatile memory that uses tunneling magnetoresistance (TMR or MR) to store information. MRAM includes an electrically connected array of magnetoresistive memory elements, referred to as magnetic tunnel junctions (MTJs). Each MTJ includes a free layer and fixed/reference layer that each includes a magnetic material layer. A non-magnetic insulating tunnel barrier separates the free and fixed/reference layers. The free layer and the reference layer are magnetically de-coupled by the tunnel barrier. The free layer has a variable magnetization direction, and the reference layer has an invariable magnetization direction.

An MTJ stores information by switching the magnetization state of the free layer. When magnetization direction of the free layer is parallel to the magnetization direction of the reference layer, the MTJ is in a low resistance state. Conversely, when the magnetization direction of the free layer is antiparallel to the magnetization direction of the reference layer, the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM.

SUMMARY

According to an embodiment, a method of making a magnetic random access memory (MRAM) device includes forming a magnetic tunnel junction (MTJ) on an electrode, the MTJ including a reference layer positioned in contact with the electrode, a free layer, and a tunnel barrier layer arranged between the reference layer and the free layer; and depositing an encapsulating layer on and along sidewalls of the MTJ by physical sputtering or ablation of a target material onto the MTJ.

According to another embodiment, a method of making a magnetic random access memory (MRAM) device includes forming a magnetic tunnel junction (MTJ) on an electrode, the MTJ including a reference layer positioned in contact with the electrode, a free layer, and a tunnel barrier layer arranged between the reference layer and the free layer; and depositing an encapsulating layer on and along sidewalls of the MTJ by physical sputtering of a stoichiometric silicon nitride target material onto the MTJ.

Yet, according to another embodiment, a method of making a magnetic random access memory (MRAM) device includes forming a magnetic tunnel junction (MTJ) on an electrode, the MTJ including a reference layer positioned in contact with the electrode, a free layer, and a tunnel barrier layer arranged between the reference layer and the free layer; and depositing an encapsulating layer on and along sidewalls of the MTJ by using an ion beam source to ablate a stoichiometric $Si_3N_4$ or $Al_2O_3$ material from a target and onto the MTJ.

BRIEF DESCRIPTION OF THE DRAWINGS

The subject matter, which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-3 illustrate exemplary methods of making MRAM devices according to various embodiments, in which:

FIG. 1 is a cross-sectional side view of a patterned MTJ stack positioned on a contact electrode;

FIG. 2 is a cross-sectional side view after depositing an encapsulating film layer on the MTJ stack;

FIG. 3 is a cross-sectional side view after depositing an interlayer dielectric (ILD) layer on the encapsulating film layer;

DETAILED DESCRIPTION

Figure 1:
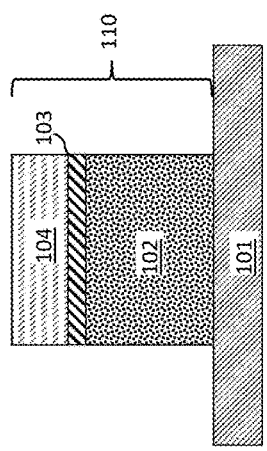

One challenge of integrating STT-MRAM devices into the wiring layers of silicon logic and memory chips is encapsulating the STT-MRAM device after patterning. The STT-MRAM device is encapsulated so that the magnetic layers and tunnel barrier layer experience minimal degradation during subsequent processing.

Accordingly, various embodiments provide methods of encapsulating devices for perpendicularly magnetized STT-MRAM that uses physically deposited silicon nitride or aluminum oxide. The silicon nitride or aluminum oxide is deposited after the last MTJ etch patterning step. Compared to chemical vapor deposition (CVD) encapsulating methods and other physical vapor deposition (PVD) methods, the disclosed processes improve device characteristics and reduce magnetic degradation at small device diameters (e.g., <50 nm).

In one embodiment, the encapsulation process is based on PVD of $Si_3N_4$ using a radio frequency (RF) diode sputter source and an argon (Ar), nitrogen ($N_2$), and oxygen ($O_2$) gas plasma. In another embodiment, the encapsulating process is based on ion beam deposition of $SiN_x$ and $AlO_x$. The process is used for encapsulating devices and forms a portion of a multi-step fabrication process for building STT-MRAM. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 2:
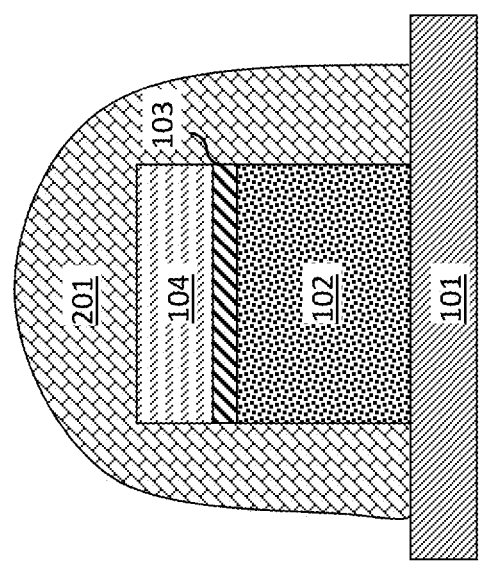
Figure 3:
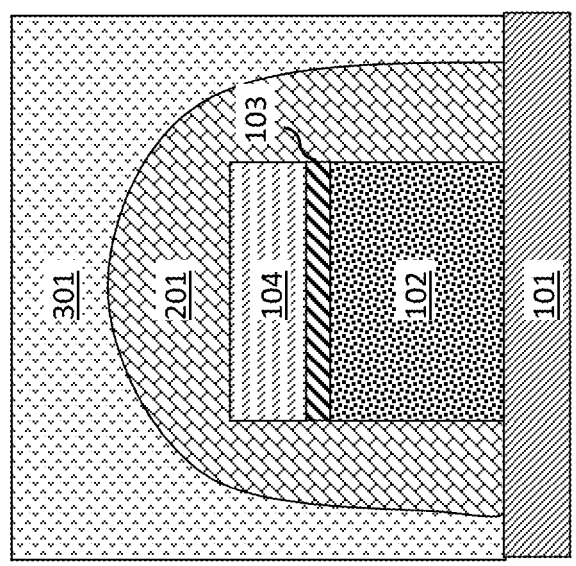

Turning now to the Figures, FIGS. 1-3 illustrate exemplary methods of making MRAM devices according to various embodiments. FIG. 1 is a cross-sectional side view of a patterned MTJ stack 110 positioned on a contact electrode 101. The MTJ stack 110 includes a reference layer 102, a tunnel barrier layer 103, and a free layer 104.

The contact electrode 101 includes a conductive material(s) and forms the bottom contact electrode of the MRAM device. Non-limiting examples of conductive materials for the contact electrode include tantalum, tantalum nitride, titanium, or any combination thereof.

The contact electrode 101 may be formed by depositing a conductive material(s) onto a surface. The conductive material(s) may be deposited by, for example, physical vapor deposition (PVD), ion beam deposition (IBD), atomic layer deposition (ALD), electroplating, or other like processes.

To form the MTJ stack 110, the reference layer 102 is formed on the contact electrode 101; the tunnel barrier layer 103 is formed on the reference layer 102; and the free layer 104 is formed on the tunnel barrier layer 103.

The reference layer 102 and the free layer 104 include conductive, magnetic materials, for example, metals or metal alloys. The reference layer 102 and the free layer 104 may be formed by employing a deposition process, for example, PVD, IBD, ALD, electroplating, or other like processes.

The reference layer 102 and the free layer 104 may include one layer or multiple layers. The reference layer 102 and the free layer 104 may include the same materials and/or layers or different materials and/or layers.

Non-limiting examples of materials for the reference layer 102 and/or the free layer 104 include iron, cobalt, boron, aluminum, nickel, silicon, oxygen, carbon, zinc, beryllium, vanadium, boron, magnesium, or any combination thereof.

The reference layer 102 has a thickness that may generally vary and is not intended to be limited. In some embodiments, the reference layer 102 has a thickness in a range from about 5 to about 25 nm. In other embodiments, the reference layer 102 has a thickness in a range from about 10 to about 15 nm.

The free layer 104 has a thickness that may generally vary and is not intended to be limited. In some embodiments, the free layer 104 has a thickness in a range from about 5 to about 25 nm. In other embodiments, the free layer 104 has a thickness in a range from about 10 to about 15 nm.

The tunnel barrier layer 103 includes a non-magnetic, insulating material. A non-limiting example of an insulating material for the tunnel barrier layer 103 is magnesium oxide (MgO). The tunnel barrier layer 103 may be formed on the reference layer 102 by, for example, radiofrequency (RF) sputtering in some embodiments. Alternatively, the tunnel barrier layer 103 is formed by oxidation (e.g., natural or radical oxidation) of a magnesium (Mg) layer deposited on the reference layer 102. After oxidation, the MgO layer may then be capped with a second layer of Mg. The thickness of the tunnel barrier layer 103 is not intended to be limited and may generally vary.

After depositing the MTJ stack 110 layers on the contact electrode 101, the MTJ stack 110 is patterned. In some embodiments, a hard mask material layer may be disposed on the MTJ stack 110. The hard mask material layer is then patterned by etching, for example, using a reactive ion etch (RIE) process or a halogen-based chemical etch process (e.g., including chlorine-containing gas and/or fluorine-containing gas chemistry). The pattern from the hard mask is transferred into the free layer 104, tunnel barrier layer 103, and reference layer 101. The free layer 104, tunnel barrier layer 103, and reference layer 102 are etched by, for example, performing a MRAM stack etch process. The stack etch process may be a RIE process or an ion beam etch (IBE) process.

FIG. 2 is a cross-sectional side view after depositing an encapsulating film 201 on the MTJ stack 110. The encapsulating film 201 includes one or more insulating materials. The insulating layer 201 encapsulates the MTJ stack 110. The encapsulating film 201 is deposited on the exposed surface and sidewalls of the MTJ stack 110 and contacts the contact electrode 101.

The thickness of the encapsulating film 201 may generally vary and is not intended to be limited. In some embodiments, the thickness of the encapsulating film 201 is in a range from about 10 to about 60 nm. In other embodiments, the thickness of the encapsulating film 201 is in a range from about 25 to about 40 nm.

In a first embodiment, the encapsulating film 201 includes silicon nitride and is deposited using a PVD method that employs a RF diode plasma source from a high purity, stoichiometric $Si_3N_4$ target. The PVD method may employ a magnetron sputter source (physical sputtering) to deposit the silicon nitride film. As an alternative, a pure Si target may be used, with nitrogen added to the working gas used for sputter deposition.

The deposition conditions for forming the encapsulating film 201 using PVD methods includes low sample temperatures (e.g., about room temperature), low power and deposition rates, and slightly reactive plasma.

The sputtered target material is a high purity, stoichiometric $Si_3N_4$ target material. In some embodiments, the target material has a purity of at least 99% pure, or about 99.95 to about 99.999% pure.

The temperature used for physical vapor deposition is low. In some embodiments, the PVD temperature is in a range from about 20 to about 25° C. In other embodiments, the PVD deposition temperature is less than 400° C. In one embodiment, the PVD temperature is about room temperature. Yet, in other embodiments, the PVD temperature is in a range from about 0 to about 250° C. Still yet, in other embodiments, the PVD temperature is in a range from about 25 to about 50° C.

The power used for PVD is low. In some embodiments, the PVD power is in a range from about 150 W to about 1000 W, depending on the requirement of deposition rate and film quality and sidewall coverage. In other embodiments, the PVD power is in a range from about 150 W to about 300 W. Yet, in other embodiments, the PVD temperature is in a range from about 50 to about 5,000 W. Still yet, in other embodiments, the PVD temperature is in a range from about 200 to about 1,000 W.

The PVD rate is also low. In some embodiments, the PVD rate is in a range from about 8 Å/min to about 20 Å/min. In other embodiments, the PVD rate is in a range from about 10 Å/min to about 15 Å/min. Yet, in other embodiments, the PVD rate is in a range from about 0.1 to about 500 nm/min, or about 5 to about 100 nm/min.

When physical sputtering is used to form the encapsulating film, reactive plasma may be used. A reactive plasma is a plasma in which one of the working gases is incorporated into the film to form a compound. For example, a small amount of $O_2$ may be combined with a large amount of Ar and $N_2$ gas. Both $O_2$ and $N_2$ will react with the target to form, for example, aluminum oxide or nitride if the target is aluminum and silicon oxide or nitride if the target is silicon. The Ar only provides a sputtering effect, without any chemical reaction. Thus, $O_2$ and $N_2$ are reactive gases, and Ar is a non-reactive gas. The proportion between $O_2$ or $N_2$ to Ar depends on the final chemical position desired in the deposited film. For example, for a Si-rich silicon nitride, the ratio of $N_2$ to Ar flow ratio would be reduced.

In a second embodiment, the encapsulating film 201 includes silicon nitride or aluminum oxide and is deposited using an ion beam source. The silicon nitride or aluminum oxide target is high purity (e.g., at least 99% pure, or from about 99.5% to about 99.999% pure), and the ion beam deposition is performed in a substantially inert atmosphere. The ion beam is used to ablate material away from the source/target.

Sub-stoichiometric amounts of AlOx and SiNx may be formed using various levels of the appropriate reactive gas ($O_2$ or $N_2$). The encapsulating film 201 may include, for example, $SiN_x$ or $AlO_x$, wherein x is the ratio of N to Si and O to Al, respectively, and x may be varied to range from pure elemental Si/Al to stoichiometric $Si_3N_4$ or $Al_2O_3$. In one embodiment, the encapsulating film 201 includes $SiN_x$, and x is from 0 to 1.33 (i.e., pure Si to $Si_3N_4$). In another embodiment, the encapsulating film 201 includes $AlO_x$, and x is from 0 to 1.5 (i.e., pure Al to $Al_2O_3$).

In some embodiments, the temperature used for ion beam deposition is in a range from about 25 to about 400° C., or from about 0 to about 250° C. In other embodiments, the temperature used for ion beam deposition is in a range from about 20 to about 25° C., or from about 25 to about 50° C.

The ion beam deposition according to the second embodiment is performed in a substantially inert atmosphere. For example, the ion beam deposition may be performed in the presence of Ar.

Optionally, pure (or substantially pure) oxygen gas is introduced into the chamber just before forming the encapsulating film 201 according to the first (PVD deposition) or second (ion beam deposition) embodiment to oxide, for example, a thin layer of aluminum when deposited by PVD. The thin layer of aluminum should be kept thin so that it is fully oxidized. Depositing a thin layer that is then exposed to oxygen gas will ensure that the layer is substantially fully oxidized. If the layer of, for example, aluminum, is too thick, it may not be substantially fully oxidized. To achieve a desired thickness of, for example, aluminum oxide, several cycles of deposition and oxidation may be performed.

FIG. 3 is a cross-sectional side view after depositing an interlayer dielectric (ILD) layer 301 on the MTJ stack 110. The ILD layer 301 may include, for example, a low-k dielectric oxide, including but not limited to, silicon dioxide, spin-on-glass, a flowable oxide, a high-density plasma oxide, or any combination thereof. The ILD layer 301 may be formed by performing deposition process, including, but not limited to CVD, PVD, plasma enhanced CVD, atomic layer deposition (ALD), evaporation, chemical solution deposition, or like processes.

The encapsulated device is then embedded into the back-end-of-line (BEOL) of a CMOS process route. The encapsulated device may be further processed.

EXAMPLES

Example 1

Figure 4:
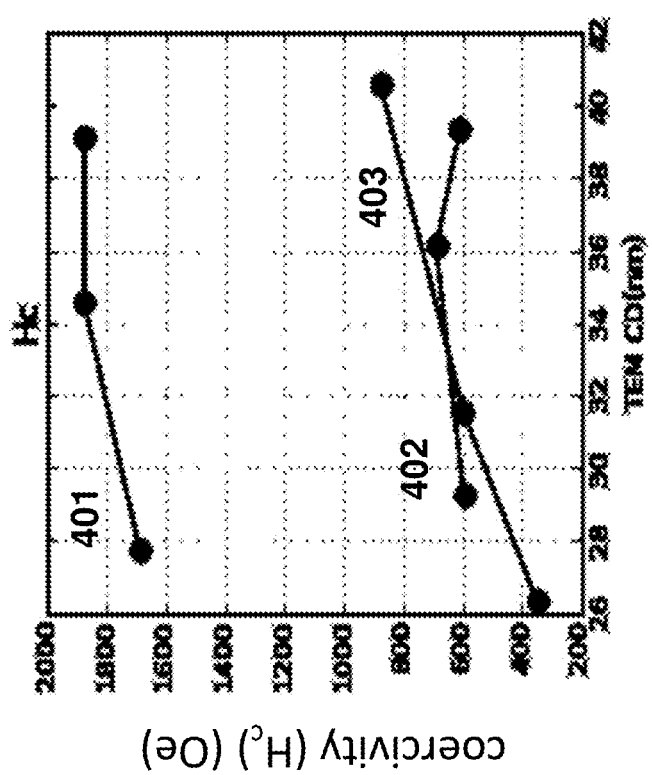
FIG. 4 is a graph illustrating reduced MRAM device degradation using PVD methods described in various embodiments.

FIG. 4 is a graph illustrating reduced MRAM device degradation using PVD encapsulating film formation methods described herein. The graph shows coercivity ($H_c$) ($O_e$) as a function of TEM CD (nm) (critical dimension (CD) measured by transmission electron microscopy (TEM)).

Trace 401 shows coercivity of a device with an encapsulating silicon nitride film that was made using PVD methods as described herein. For comparison, trace 402 shows coercivity of a device with an encapsulating silicon nitride film made using CVD methods, and trace 403 shows coercivity of a device with an encapsulating silicon nitride film made using PVD and CVD methods.

Example 2

Figure 5:
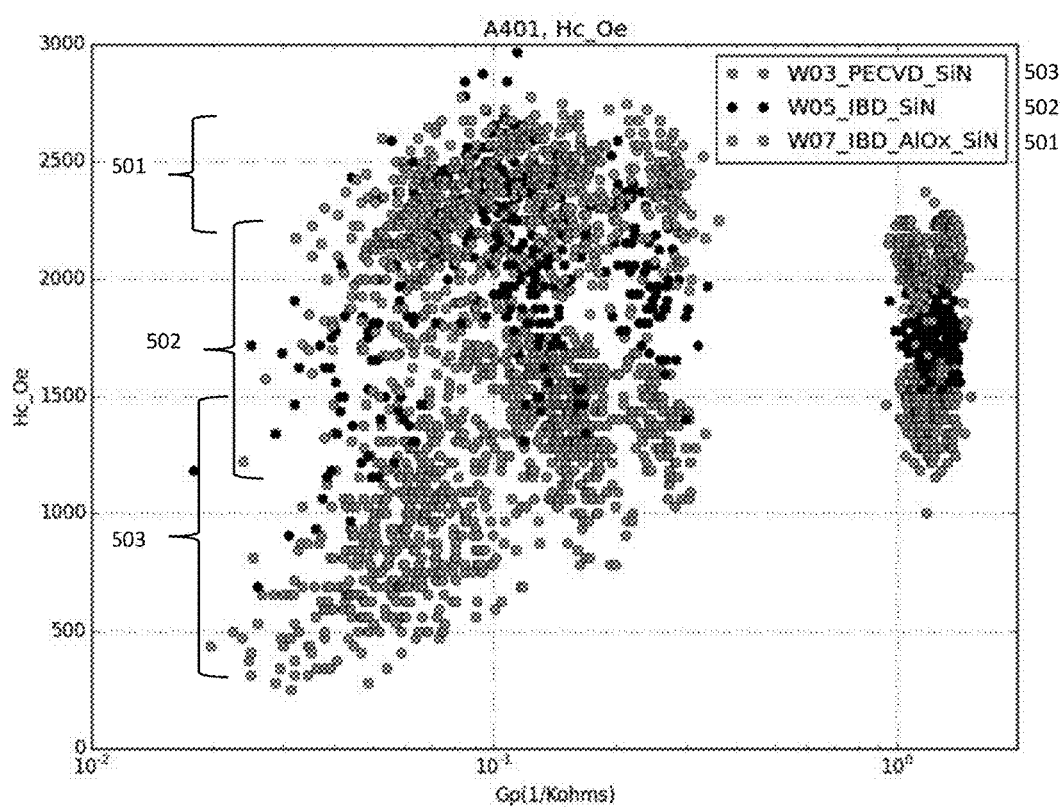
FIG. 5 is a graph illustrating reduced MRAM device degradation using ion beam methods described herein.

FIG. 5 is a graph illustrating reduced MRAM device degradation using ion beam encapsulating film formation methods described herein. The graph shows coercivity ($H_c$) (Oe) as a function of Gp (1/Kohms) (a measure of conductance, or the inverse of resistance).

Plot 501 shows coercivity of a device with an encapsulating film of silicon nitride and aluminum oxide that was made using ion beam methods as described herein. Plot 502 shows coercivity of a device with an encapsulating film of silicon nitride that was made using ion beam deposition methods. For comparison, plot 503 shows coercivity of a device that included an encapsulating silicon nitride film formed by plasma enhanced chemical vapor deposition (PECVD) methods.

As described above, various embodiments provide methods of encapsulating devices for perpendicularly magnetized STT-MRAM that uses physically deposited silicon nitride or aluminum oxide to encapsulate the MRAM device. The silicon nitride or aluminum oxide is deposited after the last MTJ etch patterning step. Compared to chemical vapor deposition (CVD) encapsulating methods and other physical vapor deposition (PVD) methods, the disclosed process improves device characteristics and reduces magnetic degradation at small device diameters (e.g., <50 nm).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a magnetic random access memory (MRAM) device, the method comprising:
    forming a magnetic tunnel junction (MTJ) on an electrode, the MTJ comprising a reference layer positioned in contact with the electrode, a free layer, and a tunnel barrier layer arranged between the reference layer and the free layer; and
    depositing a stoichiometric $Si_3N_4$ encapsulating layer directly on a top surface of the free layer and directly on sidewalls of the MTJ by physical sputtering of a target material onto the MTJ to form a silicon nitride film comprising stoichiometric $Si_3N_4$, the physical sputtering being performed with $N_2$ and Ar gases, at a temperature in a range from about 20 to about 25° C., a power in a range from about 150 to 1000 Watts (W), and at a deposition rate in a range from about 8 Ångstrom/min (Å/min) to about 20 Å/min,
    wherein the silicon nitride film comprising stoichiometric $Si_3N_4$ forms a final film on the top surface of the free layer and the sidewalls of the MTJ.

2. The method of claim 1, wherein physical sputtering is a physical vapor deposition (PVD) process that employs a magnetron sputter source.

3. The method of claim 1, wherein physical sputtering employs a radiofrequency (RF) diode plasma source.

4. The method of claim 1, wherein the target material is a stoichiometric $Si_3N_4$ target with a purity of at least 99.999%.

5. A method of making a magnetic random access memory (MRAM) device, the method comprising:
    forming a magnetic tunnel junction (MTJ) on an electrode, the MTJ comprising a reference layer positioned in contact with the electrode, a free layer, and a tunnel barrier layer arranged between the reference layer and the free layer; and
    depositing an encapsulating layer comprising pure aluminum directly on a top surface of the free layer and directly on sidewalls of the MTJ by using an ion beam source to ablate an aluminum target material onto the MTJ; and
    exposing the encapsulating layer to pure oxygen to fully oxidize the encapsulating layer and form $Al_2O_3$.

6. The method of claim 5, wherein the pure aluminum is ablated in a substantially inert atmosphere.

7. The method of claim 5, wherein the pure aluminum is ablated at a temperature in a range from about 25 to about 400° C.

8. The method of claim 5, wherein the pure aluminum has a purity of at least 99.999%.

9. The method of claim 5, further exposing the MTJ to substantially pure $O_2$ gas before depositing the encapsulating layer.

* * * * *